United States Patent
Yamashita

(10) Patent No.: US 9,299,452 B2
(45) Date of Patent: Mar. 29, 2016

(54) SHIFT REGISTERS, DISPLAY PANELS, DISPLAY DEVICES, AND ELECTRONIC DEVICES

(75) Inventor: Keitaro Yamashita, Miao-Li County (TW)

(73) Assignees: Innocom Technology (SHENZHEN) Co., Ltd., Shenzhen (CN); Innolux Corporation, Miaoli County (TW)

( * ) Notice: Subject to any disclaimer, the term of this patent is extended or adjusted under 35 U.S.C. 154(b) by 487 days.

(21) Appl. No.: 13/571,085

(22) Filed: Aug. 9, 2012

(65) Prior Publication Data

US 2014/0043304 A1    Feb. 13, 2014

(51) Int. Cl.
| | |
|---|---|
| *G09G 3/32* | (2006.01) |
| *G11C 19/28* | (2006.01) |
| *G11C 19/18* | (2006.01) |
| *G09G 3/36* | (2006.01) |

(52) U.S. Cl.
CPC ............. *G11C 19/28* (2013.01); *G09G 3/3648* (2013.01); *G09G 3/3677* (2013.01); *G11C 19/184* (2013.01); *G09G 3/3266* (2013.01); *G09G 2310/0267* (2013.01); *G09G 2310/0286* (2013.01)

(58) Field of Classification Search
None
See application file for complete search history.

(56) References Cited

U.S. PATENT DOCUMENTS

| | | | |
|---|---|---|---|
| 6,052,426 A | 4/2000 | Maurice | |
| 6,345,085 B1 * | 2/2002 | Yeo et al. | 377/54 |
| 6,483,889 B2 * | 11/2002 | Kim et al. | 377/54 |
| 6,778,627 B2 * | 8/2004 | Yu | 377/72 |
| 7,304,622 B2 * | 12/2007 | Kobayashi et al. | 345/87 |
| 7,986,761 B2 * | 7/2011 | Ieong et al. | 377/64 |
| 2002/0044625 A1 | 4/2002 | Kim et al. | |
| 2008/0016139 A1 | 1/2008 | Tsai et al. | |

FOREIGN PATENT DOCUMENTS

CN    102063858 A    5/2011

OTHER PUBLICATIONS

China Patent Office, Office Action, Patent Application Serial No. 201310344254.0, Jun. 24, 2015, China.

* cited by examiner

*Primary Examiner* — David D Davis

(57) ABSTRACT

A shift register is provided. In the shift register, each of successively cascaded shift register units includes first and second switches and first and second capacitors. For the first switch, a control terminal is coupled to a first node, an input terminal receives a first clock signal, and an output terminal is coupled to an output node. The first capacitor is coupled between the first node and the output node. The second capacitor is coupled between the output node and a ground terminal. For the second switch, an input terminal receives a second clock signal, and an output terminal is coupled to the first node. A carry signal is generated at the first node. For the N-th shift register unit, a control terminal of the second switch receives the carry signal generated at the first node of the previous shift register unit.

16 Claims, 11 Drawing Sheets

US 9,299,452 B2

SHIFT REGISTERS, DISPLAY PANELS, DISPLAY DEVICES, AND ELECTRONIC DEVICES

BACKGROUND OF THE INVENTION

1. Field of the Invention

The invention relates to a shift register, and more particularly to a shift register applied to a gate driver of a display panel.

2. Description of the Related Art

Generally, in an active matrix display device, a gate driver which is used to drive a pixel array comprises a shift register. The shift register comprises a plurality of shift register units, and each shift register unit generates an output signal at an output node to the pixel array. Each shift register unit comprises a driving transistor coupled to an output node. As found in some prior arts, the voltage applied to the gate turns on the driving transistor for driving the output signal. The resistance of driving transistor has to be smaller for better driving capability for gate driver to drive heavier capacitive loading. When the shift register of these prior arts is applied to a gate driver of an active matrix display device, the size of the driving transistor of each shift register unit has to become larger to enhance the driving capability of the driving transistor, unless increasing the voltage applied to the gate of driving transistor. Thus, the area of the gate driver also becomes larger, which disadvantageously increase the size of the ledge of the active matrix display device.

Thus, it is desired to provide a shift register which has enhanced driving capability for output signals and occupy less area, with other than the method of increasing the size of driving transistor.

BRIEF SUMMARY OF THE INVENTION

An exemplary embodiment of a shift register is provided. The shift register comprises a plurality of successively cascaded shift register units. Each shift register unit is controlled by a first clock signal and a second clock signal to generate an output signal at an output node. Each of the shift register units comprises a first switch, a first capacitor, a second capacitor, and a second switch. A control terminal of the first switch is coupled to a first node, an input terminal thereof receives the first clock signal, and an output terminal thereof is coupled to the output node. The first capacitor is coupled between the first node and the output node. The second capacitor is coupled between the output node and a ground terminal. An input terminal of the second switch receives the second clock signal, and an output terminal thereof is coupled to the first node. A carry signal is generated at the first node. For the N-th shift register unit among the shift register units, the control terminal of the second switch receives the carry signal generated at the first node of the previous shift register unit to the N-th shift register unit, N is a positive integer.

An exemplary embodiment of a display panel is provided. The display panel comprises a plurality of source lines, a plurality of gate lines, a plurality of pixel units, a source driver, and a gate driver. The gate lines interlace with the gate lines. The pixel units are arranged to form a display array. Each pixel unit corresponds to one set of the interlaced source line and gate line. The source driver is coupled to the source lines and provides data signals to the display array through the source lines. The gate driver is coupled to the gate lines. The gate driver comprises the shift register of the above embodiment for generating output signals to the display array through the gate lines.

An exemplary embodiment of a display device is provided. The display device comprises the display panel of the above embodiment and a controller. The controller is operatively coupled to the display panel.

An exemplary embodiment of an electronic device is provided. The electronic device comprises the display device of the above embodiment and an input unit. The input unit is operatively coupled to the display device.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
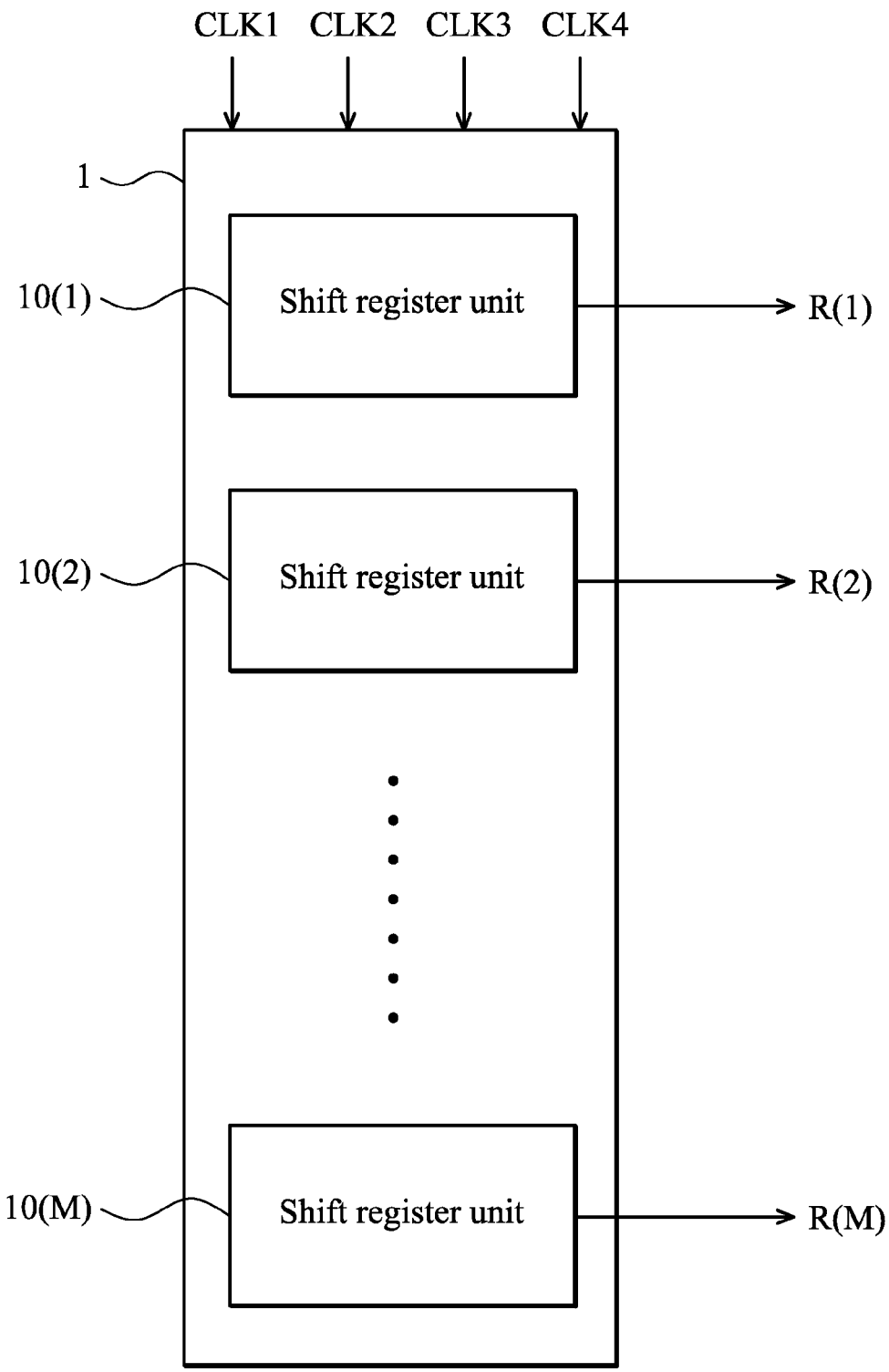
FIG. 1 shows an exemplary embodiment of a shift register.
Figure 2:
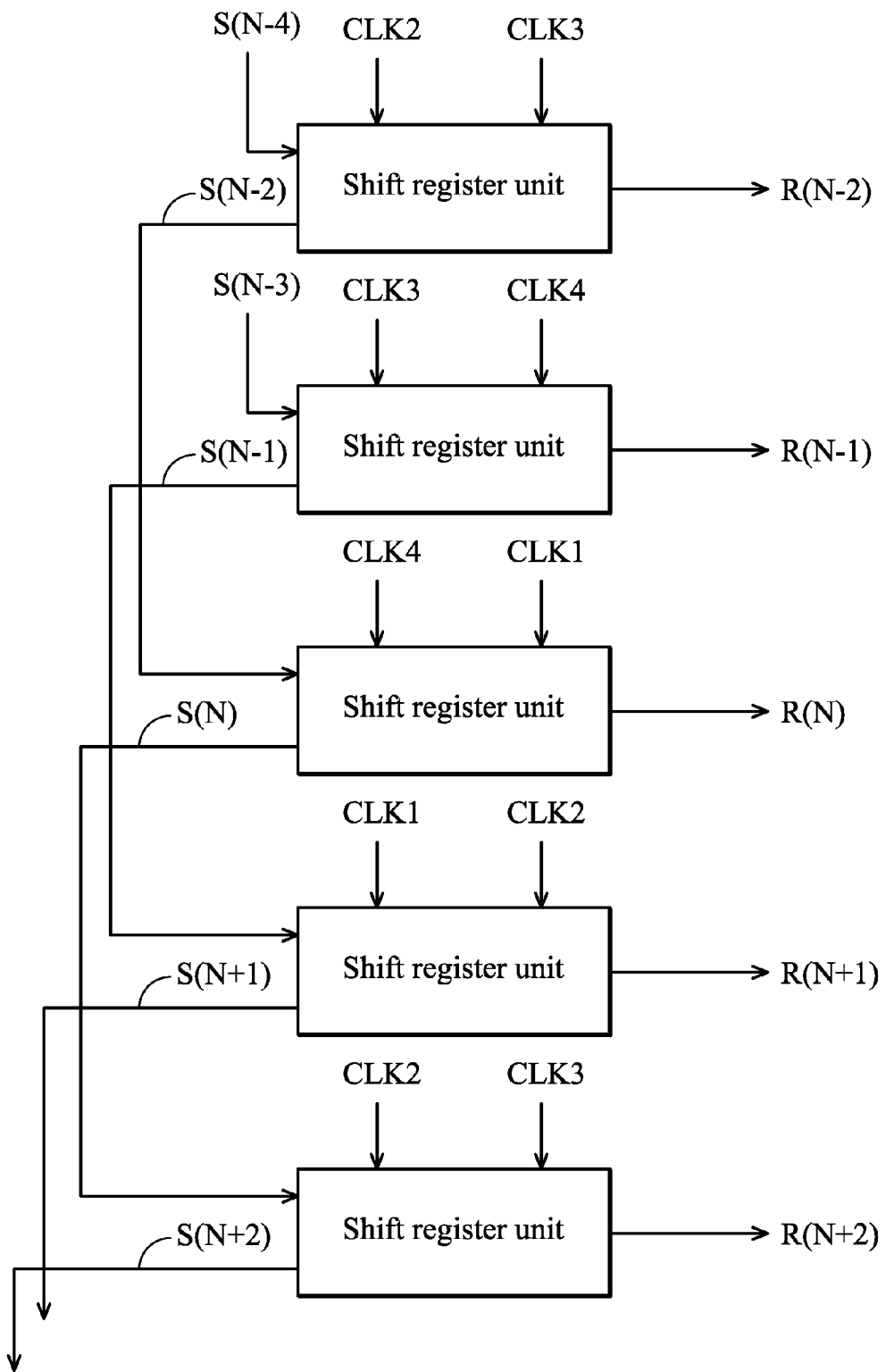
FIG. 2 shows exemplary shift register units among shift register units in the shift register of FIG. 1.

Shift registers are provided. In an exemplary embodiment of a shift register in FIG. 1, a shifter register 1 comprises a plurality of shift register units 10(1)~10(M) and operates according to the clock signals CLK1~CLK4, wherein M is a positive integer. The shift register units 10(1)~10(M) are successively cascaded and generate output signals R(1)~R(M) respectively. FIG. 2 shows five exemplary shift register units among shift register units 10(1)~10(M) in the shift register 1. Referring to FIG. 2, each of the (N−2)-th to (N+2)-th register units 10(N−2)~10(N+2) among the shift register units 10(1) ~10(M) receives at least two clock signals among the clock signals CLK1~CLK4 and a carry signal generated by a previous shift register unit to generate the correspondingly output signal, wherein N is a positive integer and 5≤N≤M−4. For example, the N-th shift register unit 10(N) receives the clocks signals CLK1 and CLK4 and the carry signal S(N−2) generated by the (N−2)-th shift register unit 10(N−2) and generates the output signal R(N). The carry signal S(N) generated by the N-th shift register unit 10(N) is provided to the (N+2)-th shift register unit 10(N+2). According to the rule of the receipt of the clock signals and the carry signal by the N-th shift register unit 10(N) in the embodiment of FIG. 2, the carry signals received by the first and second shift register units 10(1) and 10(2) among shift register units 10(1)~10(M) may be generated by the (M−1)-th and M-th register units 10(M−1) and 10(M) among shift register units 10(1)~10(M) respectively or by other circuits in the shift register 1. The shift register 1 may be processed with amorphous silicon technology, low temperature poly-silicon technology, or oxide thin film transistor technology.

Figure 3:
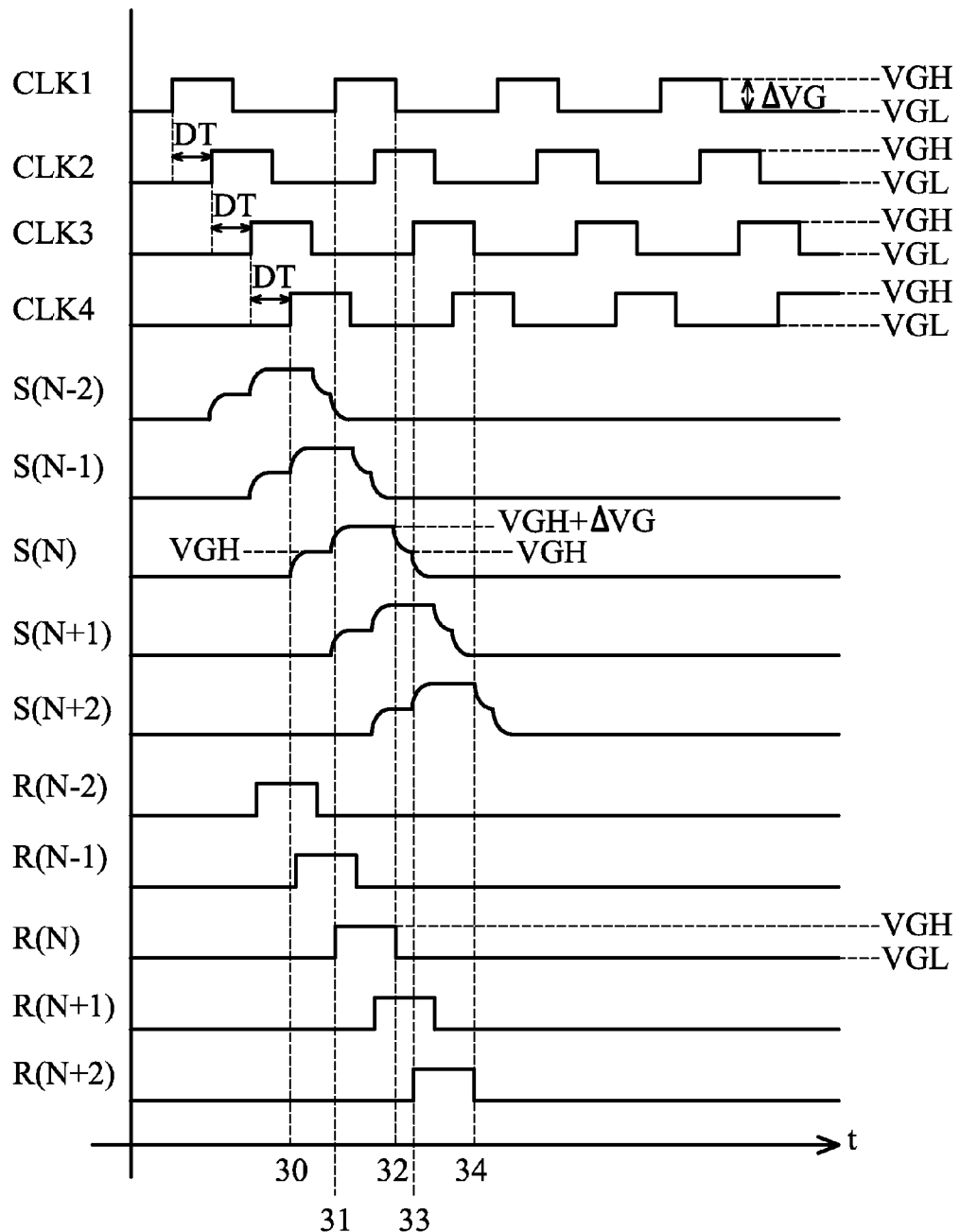
FIG. 3 shows timing of clock signals and the output signals and waveforms of carry signals for the shift register units of FIG. 2.

FIG. 3 shows timing of the clock signals CLK1~CLK4 and the output signals R(N−2)~R(N+2) and the waveforms of the carry signals S(N−2)~S(N+2) respectively generated by the (N−2)-th and (N+2)-th register units 10(N−2) and 10(N+2) among shift register units 10(1)~10(M). Each of the clock signals CLK1~CLK4 is switched between a high voltage level VGH and a low voltage level VGL. As shown in FIG. 3, the timing of the clock signal CLK2 is delayed from the timing of the clock signal CLK1 by a delayed time period DT, the timing of the clock signal CLK3 is delayed from the timing of the clock signal CLK2 by a delayed time period DT, and the timing of the clock signal CLK4 is delayed from the timing of the clock signal CLK3 by a delayed time period DT. The output signals R(N−2)~R(N+2) are enabled (high voltage level VGH) successively.

In the following, the N-th shift register unit 10(N) is given an example to illustrate the present invention.

Figure 4:
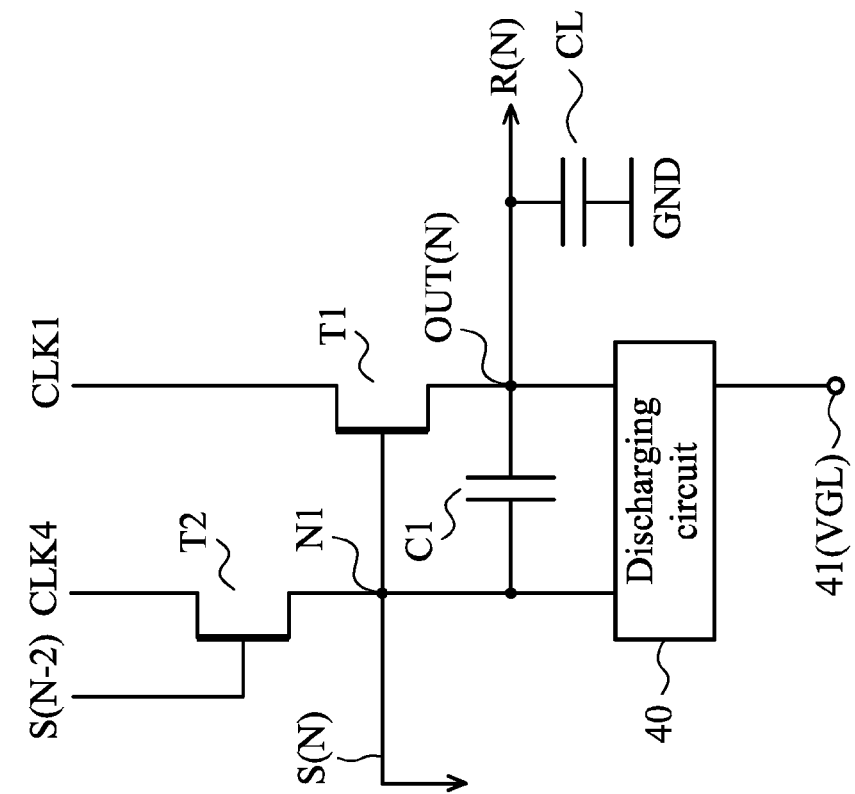
FIG. 4 shows an exemplary embodiment of one register units in the shift register of FIG. 1.

FIG. 4 shows an exemplary embodiment of the N-th register unit 10(N). Referring to FIG. 4, the N-th register unit 10(N) comprises two switches T1 and T2, two capacitors C1 and CL, and a discharging circuit 40. Each of the switches T1 and T2 has a control terminal, an input terminal, and an output terminal. In the embodiment of FIG. 4, the switches T1 and T2 are implemented by N-type transistor. For each of the switches T1 and T2, the control terminal, the input terminal, and the output terminal are referred to as the gate, the drain, and the source of the N-type transistor. As shown in FIG. 4, the gate of the transistor T1 is coupled to a node N1, the drain thereof receives the clock signal CLK1, and the source thereof is coupled to an output node OUT(N) where the output signal R(n) is generated. The capacitor C1 is coupled between the node N1 and the output node OUT(N). The capacitor CL is coupled between the output node OUT(N) and a ground terminal GND. The gate of the transistor T2 receives the carry signal S(N−2) generated by the (N−2)-th register unit 10(N−2), the drain thereof receives the clock signal CLK4, and the source thereof is coupled to the node N1. The discharging circuit 40 is coupled between a low voltage terminal 41 and both of the node N1 and the output node OUT(N). In the embodiment, the low voltage terminal 41 provides a voltage with the low voltage level VGL.

The operation of the N-th shift register 10(N) will be described by referring to FIGS. 3 and 4. At the time point 30, the transistor T2 is turned on by the carry signal S(N−2). The clock signal CLK4 with the high voltage level VGH is transmitted to the node N1 through the turned-on transistor T2, and, thus, the voltage level of the carry signal S(N) at the node N1 is increased to the high voltage level VGH from the initial voltage level to turn on the transistor T1. During the period between the time point 30 to the time point 31, since the clock signal CLK1 is at the low voltage level VGL, the output signal R(N) is at the low voltage level VGL (that is the output signal R(N) is at a disabled state).

At the time point 31, the clock signal CLK1 is switches to the high voltage level VGH, and, thus, the output signal R(N) is switches to the high voltage level VGH (that is the output signal R(N) is switched to an enabled state) due to the turned-on transistor T1. In the period between the time point 31 and the time point 32, the transistor T2 is turned off by the carry signal S(N−2). Through the feed-through effect of the capacitor C1, the voltage level of the carry signal S(N) at the node N1 is further increased by the difference $\Delta VG$ between the high voltage level VGH and the low voltage level ($\Delta VG=VGH-VGL$), that is the voltage level of the carry signal S(N) is increased to the voltage level (VGH+$\Delta VG$).

At the time point 32, the clock signal CLK1 is switches to the low voltage level VGL, and, thus, the output signal R(N) is switches to the low voltage level VGL (that is the output signal R(N) is switched to the disabled state) due to the turned-on transistor T1. In the period between the time point 32 and the time point 33, through the feed-through effect of the capacitor C1, the voltage level of the carry signal S(N) at the node N1 is then decreased by the difference $\Delta VG$ between the high voltage level VGH and the low voltage level, that is the voltage level of the carry signal S(N) is equal to the voltage level VGH.

At the time point 33, the discharging circuit 40 couples the node N1 and the output node OUT(N) to the low voltage terminal 41 (VGL). Accordingly, the capacitor C1 is discharged, and the voltage level of the carry signal S(N) at the node N1 begins to be decreased to the initial voltage level. Moreover, since the output terminal OUT(N) is coupled to the low voltage terminal 41 (VGL), the extra pulse at the output node OUT(N) induced by channel leakage current can be prevented, such that the output signal R(N) can remain the low voltage level VGL after the output signal R(N) is switched to the disabled state at the time point 32.

The other shift register units have the same circuit structure of the N-th register unit 10(N) and operate according to the respective clock signals and the received carry signals. In the (N−2)-th shift register unit 10(N−2), the drain of the transistor T1 receives the clock signal CLK3, the drain of the transistor T2 receives the clock signal CLK2, and the gate of the transistor T2 receives the carry signal S(N−4) generated by the (N−4)-th shift register unit 10(N−4). In the (N−1)-th shift register unit 10(N−1), the drain of the transistor T1 receives the clock signal CLK4, the drain of the transistor T2 receives the clock signal CLK3, and the gate of the transistor T2 receives the carry signal S(N−3) generated by the (N−3)-th shift register unit 10 (N−3). In the (N+1)-th shift register unit 10(N+1), the drain of the transistor T1 receives the clock signal CLK2, the drain of the transistor T2 receives the clock signal CLK1, and the gate of the transistor T2 receives the carry signal S(N−1) generated by the (N−1)-th shift register unit 10 (N−3). In the (N+2)-th shift register unit 10(N+2), the drain of the transistor T1 receives the clock signal CLK3, the drain of the transistor T2 receives the clock signal CLK2, and the gate of the transistor T2 receives the carry signal S(N) generated by the (N)-th shift register unit 10 (N).

According to the circuit structure of the shift register units in FIG. 4, during the period between the time point 31 and the time point 32, the voltage level of the carry signal S(N) at the node N1 is increased to the voltage level (VGH+(VGH−VGL)), that is the voltage level at the gate of the transistor T1 is much higher than the high voltage level VGH to turn on the transistor T1. Accordingly, the driving capability of the transistor T1 is enhanced due to the high gate voltage without increased size. Compared with the above prior arts, when the shift register 1 is applied to a gate driver of a display device, the gate driver with the enhanced driving capability occupies a small area in the display device.

Figure 5:
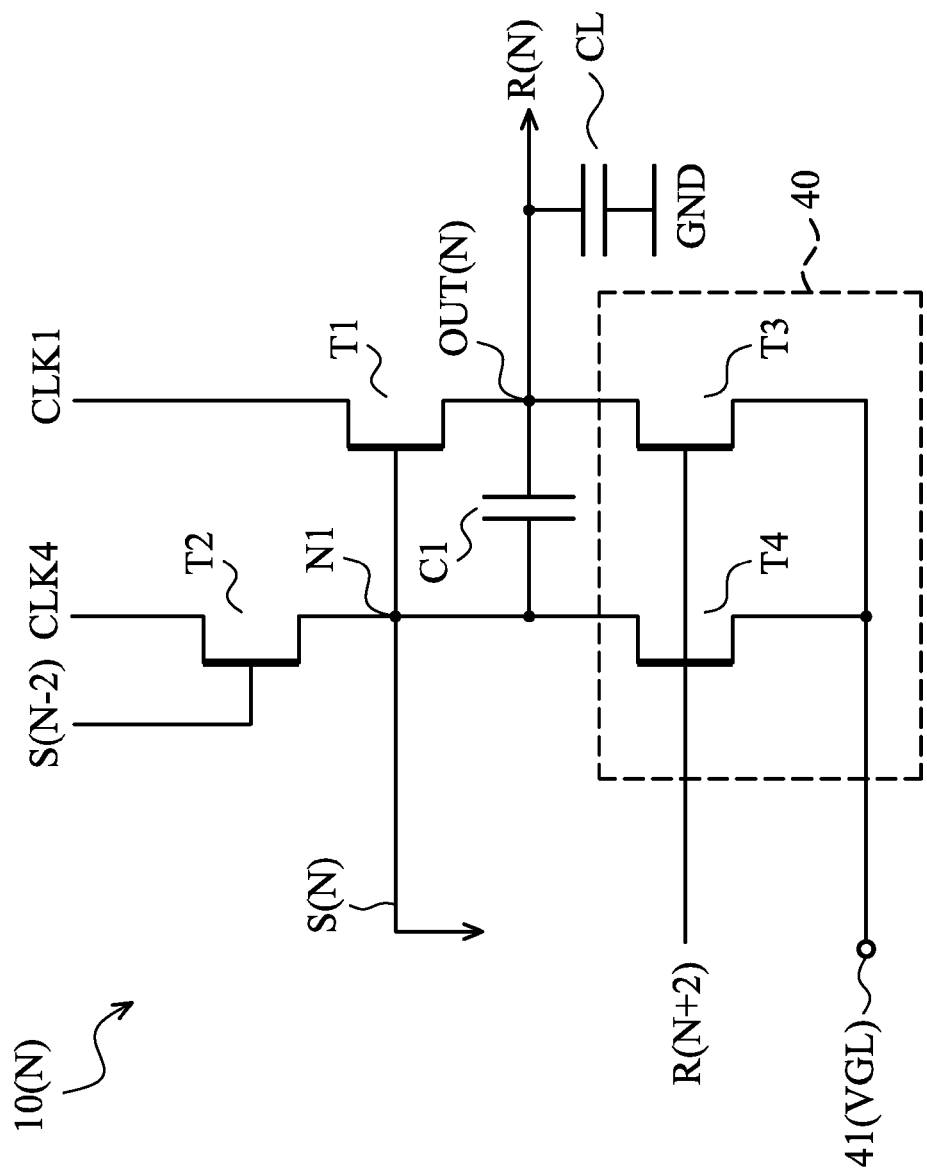
FIG. 5 shows one exemplary embodiment of a discharging circuit in the register unit of FIG. 4.

FIG. 5 shows one exemplary embodiment of the discharging circuit 40 in each shift register unit. The shift register unit 10(N) is given as an example. Referring to FIG. 5, the discharging circuit 40 comprises two switches T3 and T4. Each of the switches T3 and T4 has a control terminal, an input terminal, and an output terminal. In the embodiment of FIG. 5, the switches T3 and T4 are implemented by N-type transistor. For each of the switches T3 and T4, the control terminal, the input terminal, and the output terminal are referred to as the gate, the drain, and the source of the N-type transistor. As shown in FIG. 5, the gates of the transistors T3 and T4 receive the output signal generated by the following shift register unit. In the embodiment, the gates of the transistors T3 and T4 receive the output signal R(N+2) from the (N+2)-th shift register unit. The drain of the transistor T3 is coupled to the output node OUT(N), and the source thereof is coupled to the low voltage terminal 41 (VGL). The drain of the transistor T4 is coupled to the node N1, and the source thereof is coupled to the low voltage terminal 41 (VGL). Referring to FIGS. 3 and 5, in the period between the time point 33 to the time point 34, the output signal R(N+2) is at the high voltage level VGH to turn on the transistors T3 and T4, such that the node N1 and the output node OUT(N) are coupled to the low voltage terminal 41 (VGL).

Figure 6:
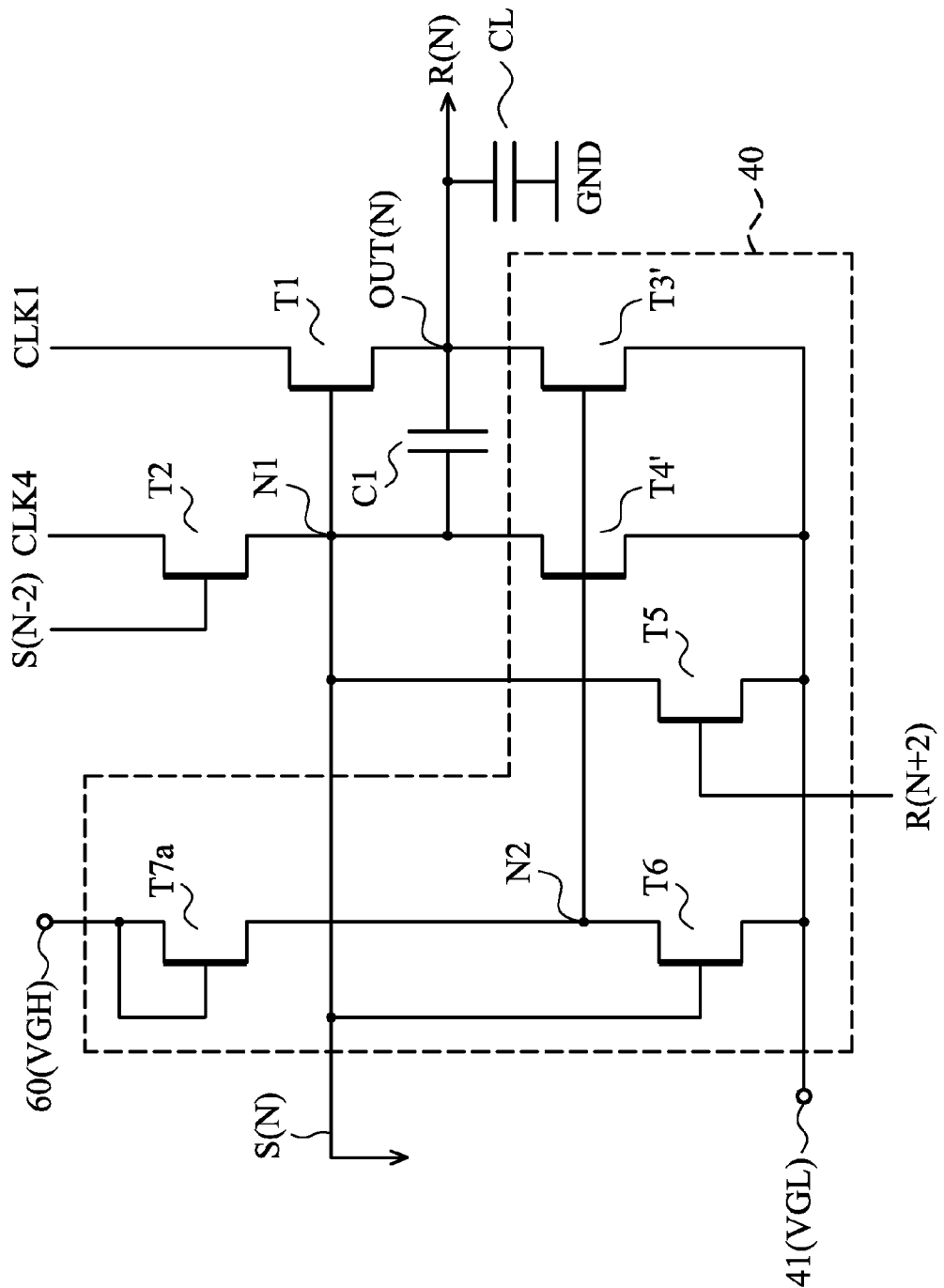
FIG. 6 shows another exemplary embodiment of a discharging circuit in the register unit of FIG. 4.

FIG. 6 shows another exemplary embodiment of the discharging circuit 40 in each shift register unit. The shift register unit 10(N) is given as an example. Referring to FIG. 6, the discharging circuit 40 comprises switches T3', T4', T5, T6, and T7a. Each of the switches T3', T4', T5, T6, and T7a has a control terminal, an input terminal, and an output terminal. In the embodiment of FIG. 6, the switches T3', T4', T5, T6, and T7a are implemented by N-type transistor. For each of the switches T3', T4', T5, T6, and T7a, the control terminal, the input terminal, and the output terminal are referred to as the gate, the drain, and the source of the N-type transistor. As shown in FIG. 6, the gate of the transistor T3' is coupled to a node N2, the drain thereof is coupled to the output node OUT(N), and the source thereof is coupled to the low voltage terminal 41 (VGL). The gate of the transistor T4' is coupled to the node N2, the drain thereof is coupled to the node N1, and the source thereof is coupled to the low voltage terminal 41 (VGL). The gate of the transistor T5 receives the output signal generated by the following shift register unit. In the embodiment, the gate of the transistor T5 receives the output signal R(N+2) from the (N+2)-th shift register unit. Moreover, the drain of the transistor T5 is coupled to the node N1, and the source thereof is coupled to the low voltage terminal 41 (VGL). The gate of the transistor T6 is coupled to the node N1, the drain thereof is coupled to the node N2, and the source thereof is coupled to the low voltage terminal 41 (VGL). The gate and drain of the transistor T7a are coupled to a high voltage terminal 60, and the source thereof is coupled to the node N2. In the embodiment, the high voltage terminal 60 provides a voltage with the high voltage level VGH. Accordingly, the transistor T7a is always turned on. Referring to FIGS. 3 and 6, in the period between the time point 33 to the time point 34, the output signal R(N+2) is at the high voltage level VGH to turn on the transistor T5, and the carry signal S(N) at the node N1 is decreased to turn off the transistor T6. At this time, the voltage level at the node N2 is high according to the high voltage level VGH through the turned-on transistor T7a to turn on the transistors T3' and T4', and, thus, the node N1 and the output node OUT(N) are coupled to the low voltage terminal 41 (VGL). Moreover, according to the connection structure of the transistor T7a, the transistor T7a acts as a diode. The anode and the cathode of the diode T7a are coupled to the high voltage level VGH and the node N2 respectively. The diode T7a provides negative threshold shift to the node N2 to enhance the tolerance to high ambient temperature when the node N1 and the output OUT(N) is continuously coupled to the low voltage terminal 41 (VGL) through the transistors T3' and T4' after the time point 33.

Figure 7:
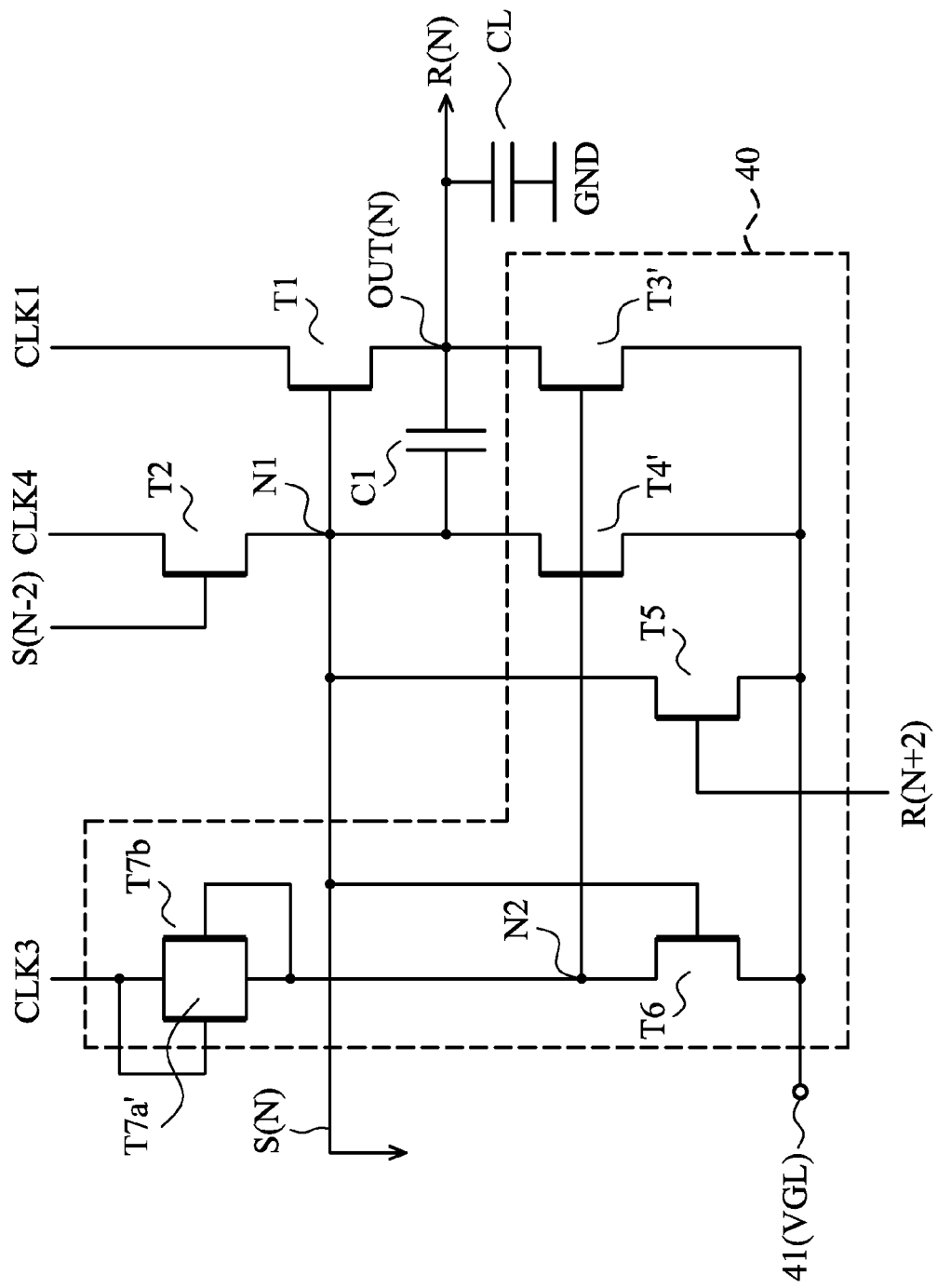
FIG. 7 shows further another exemplary embodiment of a discharging circuit in the register unit of FIG. 4.

FIG. 7 shows further another exemplary embodiment of the discharging circuit 40 in each shift register unit. The shift register unit 10(N) is given as an example. Referring to FIG. 7, the discharging circuit 40 comprises switches T3', T4', T5, T6, T7a', and T7b. The connection structures and operations of the switches T3', T4', T5, and T6 have been described in the embodiment of FIG. 6, and, thus, the related description is omitted. Each of the switches T7a' and T7b has a control terminal, an input terminal, and an output terminal. In the embodiment of FIG. 7, the switches T7a' and T7b are implemented by N-type transistor. For each of the switches T7a' and T7b, the control terminal, the input terminal, and the output terminal are referred to as the gate, the drain, and the source of the N-type transistor. As shown in FIG. 7, the gate and drain of the transistor T7a' receive the clock signal CLK3, and the source thereof is coupled to the node N2. The drain of the transistor T7b receives the clock signal CLK3, and the gate and source thereof are coupled to the node N2. According to the connection structures of the transistors T7a' and T7b, each of the transistors T7a' and T7b acts as a diode. The diodes T7a' and T7b are coupled in parallel. In detailed, the anode and the cathode of the diode T7a' are coupled to the cathode and the anode of the transistor T7b respectively. Note that that the clock signal CLK3 switched between the high voltage level VGH and the low voltage level VGL is provided to the anode of the diode T7a' and the cathode of the diode T7b. Referring to FIGS. 3 and 7, after the time point 33, when the clock signal CLK3 is at the high voltage level VGH, the diode T7a' provides negative threshold shift to the node N2. When the clock signal CLK3 is at the low voltage level VGL after the time point 33, the threshold of the diode T7b is used to compensate the negative threshold shift provided by the diode T7a'.

Figure 8:
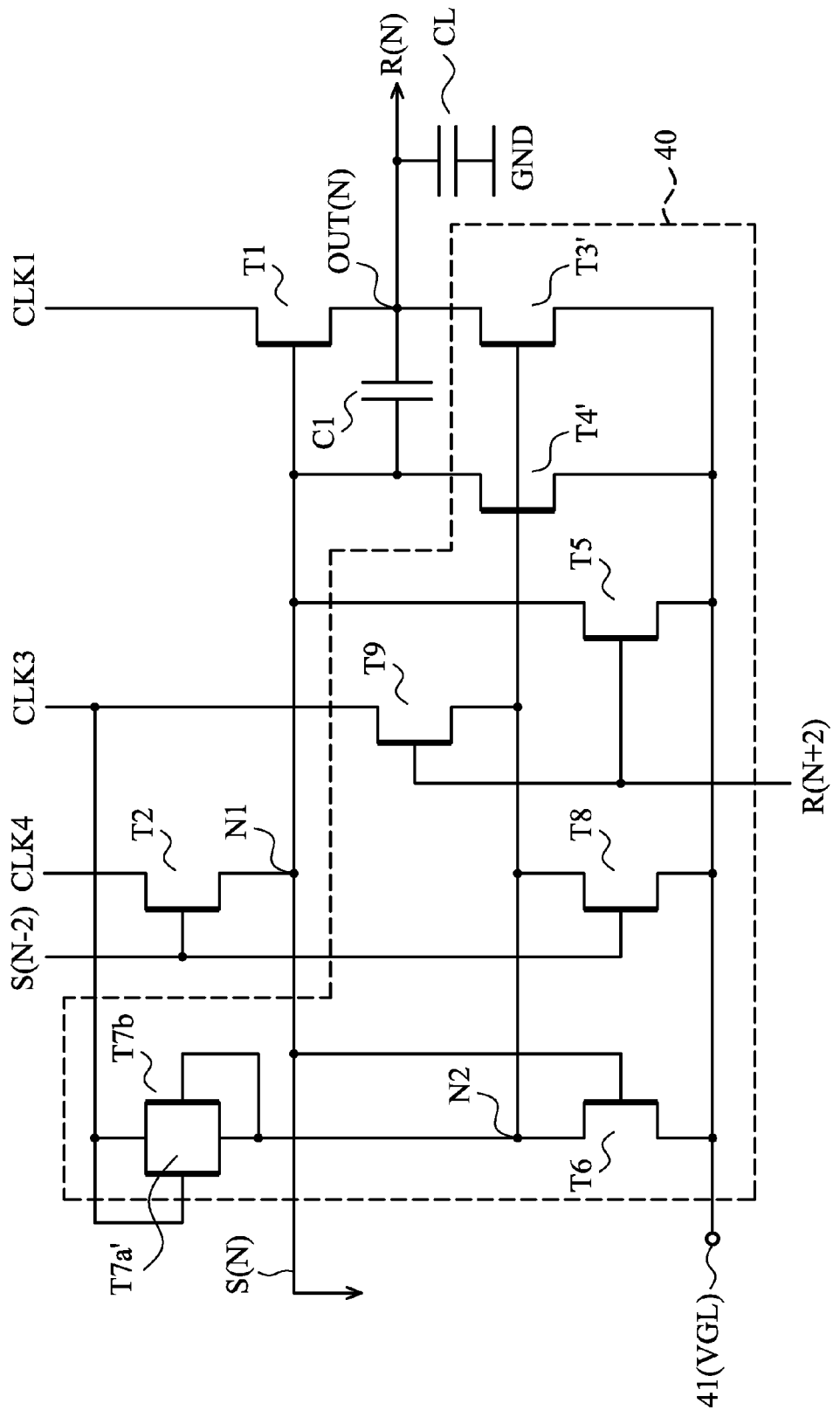
FIG. 8 shows another exemplary embodiment of a discharging circuit in the register unit of FIG. 4.

FIG. 8 shows another exemplary embodiment of the discharging circuit 40 in each shift register unit. The shift register unit 10(N) is given as an example. Referring to FIG. 8, the discharging circuit 40 comprises switches T3', T4', T5, T6, T7a', T7b, T8, and T9. The connection structures and operations of the switches T3', T4', T5, T6, T7', and T7b have been described in the embodiments of FIGS. 6 and 7, and, thus, the related description is omitted. Each of the switches T8 and T9 has a control terminal, an input terminal, and an output terminal. In the embodiment of FIG. 8, the switches T8 and T9 are implemented by N-type transistor. For each of the switches T8 and T9, the control terminal, the input terminal, and the output terminal are referred to as the gate, the drain, and the source of the N-type transistor. As shown in FIG. 8, the gate of the transistor T8 is coupled to the gate of the transistor T2, the drain thereof is coupled to the node N2, and the source thereof is coupled to the low voltage terminal 41 (VGL). The gate of the transistor T9 is coupled to the gate of the transistor T5, the drain thereof receives the clock signal CLK3, and the source thereof is coupled to the node N2. According to the connection of the gates of the transistors T8, and T9, the gate of the transistor T8 receives the carry signal S(N−2) generated at the node N1 of the (N−2)-th shift register unit 10(N−2), and the gate of the transistor T9 receives the output signal R(N+2) from the (N+2)-th shift register unit. The transistors T8 and T9 are use to control the voltage level at the node N2 for changing the states of the transistors T3' and T4', thereby improving the transient speed of the carry signal S(N).

Figure 9:
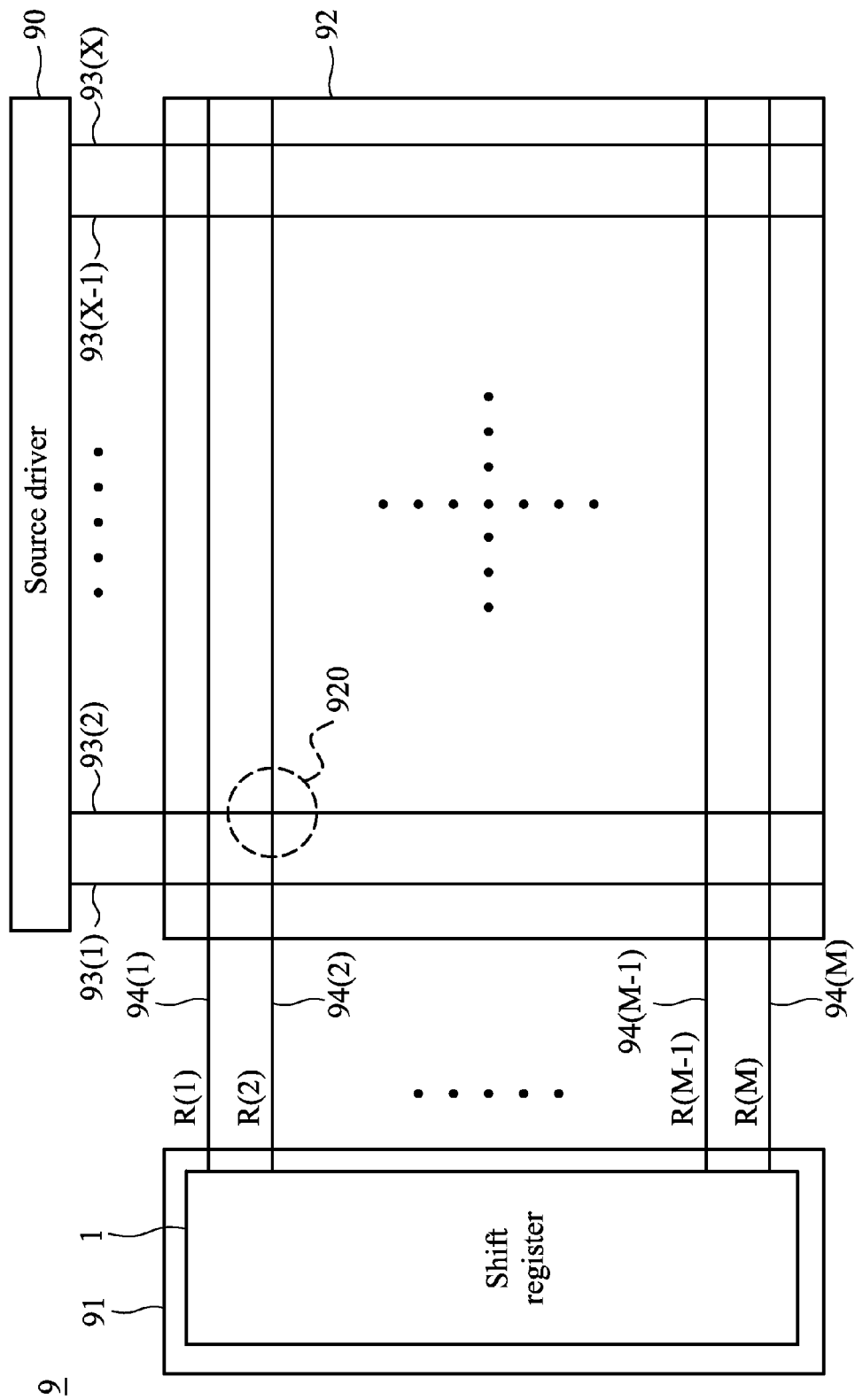
FIG. 9 shows an exemplary embodiment of a display panel employing the shift register of FIG. 1.

FIG. 9 shows an exemplary embodiment of a display panel. As shown in FIG. 9, a display panel 9 comprises a source driver 90, a gate driver 91, a display array 92, and a plurality of source lines 93(1)~93(X), and a plurality of gate lines 94(1)~94(M), wherein X is a positive integer. The gate lines 94(1)~94(M) interlace with the source lines 93(1)~93(X). The display array 92 comprises a plurality of pixel units 920 arranged in a matrix, and each pixel unit corresponds to one set of the interlaced source and gate line. The source driver 90 is coupled to the source lines 93 (1)~93(X) and used to provide data signals to the display array 92 through the source lines 93 (1)~93(X). The gate driver 91 is coupled to the gate lines 94(1)~94(M). Referring to FIG. 9, the gate diver 91 comprises the shift register 1 of FIG. 1. The shift register 1 generates the output signal R(1)~R(M), and the output signal R(1)~R(M) are provided to the display array 92 through the gate lines 94(1)~94(M) respectively. In the embodiment, the display panel 9 is a liquid crystal display panel.

Figure 10:
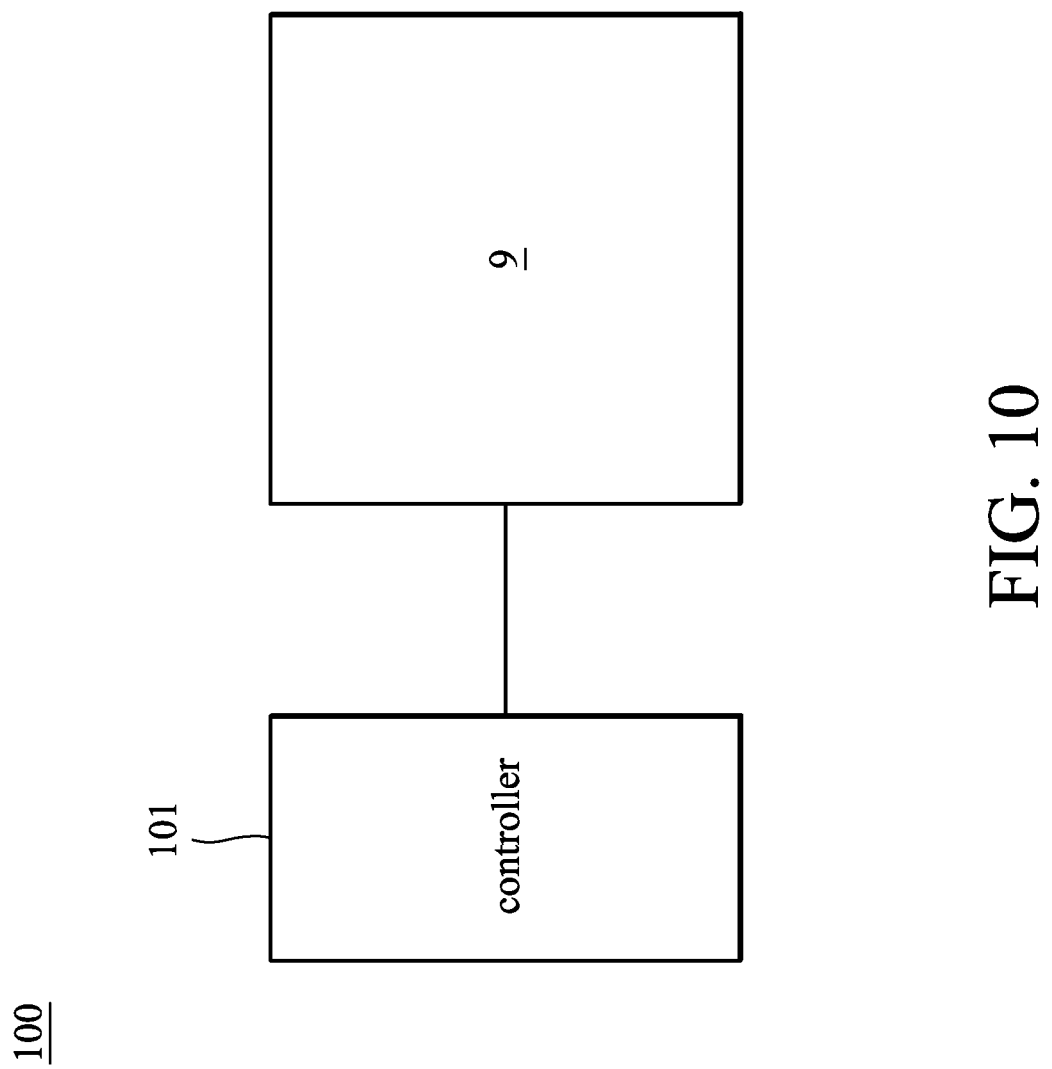
FIG. 10 shows exemplary embodiment of a display device employing the display panel of FIG. 9.

FIG. 10 shows exemplary embodiment of a display device employing the disclosed display panel 9. Generally, a display device 100 includes a controller 101, and the display panel 9 shown in FIG. 9, etc. The controller 101 is operatively coupled to the display panel 9 and provides control signals, such as clock signals, start pulses, or image data, etc, to the display panel 9.

Figure 11:
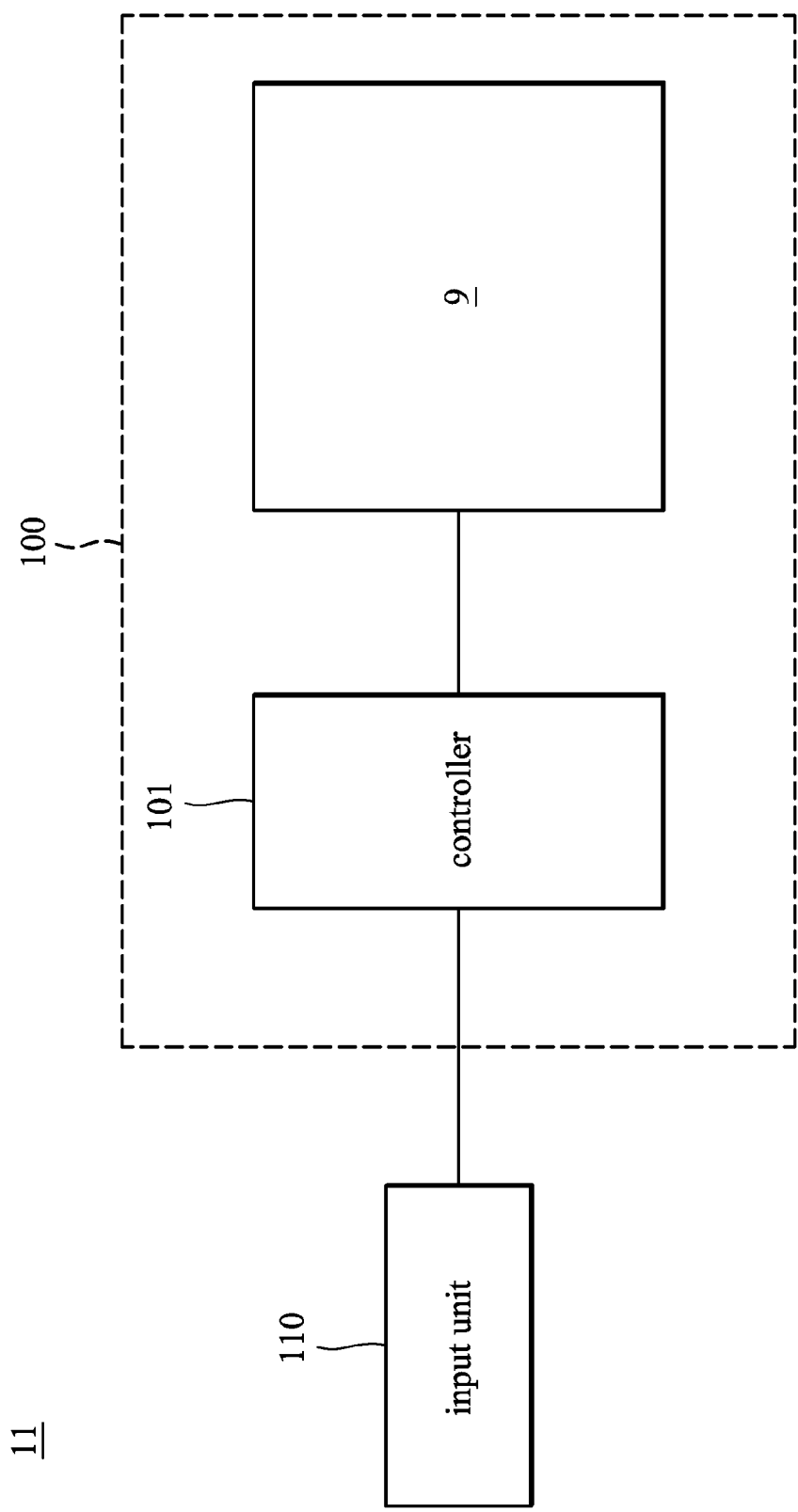
FIG. 11 shows an exemplary embodiment of an electronic device employing the display device of FIG. 10.

FIG. 11 shows an exemplary embodiment of an electronic device employing the disclosed display device 100. An electronic device 11 of the embodiment may be a portable device such as a PDA (personal digital assistant), a digital camera, a display monitor, a notebook computer, a tablet computer, a cellular phone, or similar. Generally, the electronic device 11 comprises an input unit 110 and the display device 100 shown in FIG. 10, etc. Further, the input unit 110 is operatively coupled to the display device 100 and provides input signals (e.g., image signal) to the display device 100. The controller 101 of the display device 100 provides the control signals to the display panel 9 according to the input signals.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A shift register comprising:
a plurality of successively cascaded shift register units, each controlled by a first clock signal and a second clock signal to generate an output signal at an output node, wherein each of the shift register units comprises:
a first switch having a control terminal coupled to a first node, an input terminal receiving the first clock signal, and an output terminal coupled to the output node;
a first capacitor coupled between the first node and the output node;
a second capacitor coupled between the output node and a ground terminal; and
a second switch having a control terminal, an input terminal receiving the second clock signal, and an output terminal coupled to the first node,
wherein a carry signal is generated at the first node, and wherein for a N-th shift register unit among the shift register units, the control terminal of the second switch receives the carry signal generated at the first node of the previous shift register unit to the N-th shift register unit, N is a positive integer.

2. The shift register as claimed in claim 1, wherein for the N-th shift register unit, the carry signal received by the control terminal of the second switch is generated at the first node of a (N−2)-th shift register unit, and timing of the second clock signal is delayed from timing of the first clock signal.

3. The shift register as claimed in claim 1, wherein each of the shift register units further comprises:
a discharge circuit, coupled to the first node and the output node, for coupling the first node and the output node to a low voltage terminal,
wherein the discharge circuit charges the first capacitor after a level of the output signal is switched from an enabled state to a disabled state.

4. The shift register as claimed in claim 3, wherein the discharging circuit of each of the shift register units comprises:
a third switch having a control terminal, an input terminal coupled to the output node, and an output terminal coupled to the low voltage terminal; and
a fourth switch having a control terminal, an input terminal coupled to the first node, and an output terminal coupled to the low voltage terminal,
wherein for the N-th shift register unit, the control terminals of the third and fourth switches receive the output signal generated by the following shift register unit to the N-th shift register unit.

5. The shift register as claimed in claim 4, wherein for the N-th shift register units, the carry signal received by the control terminal of the second switch is generated at the first node of a (N−2)-th shift register unit, and the output signal received by the control terminals of the third and fourth switches is generated by a (N+2)-th shift register unit.

6. The shift register as claimed in claim 3, wherein the discharging circuit of each of the shift register units comprises:
a third switch having a control terminal coupled to a second node, an input terminal coupled to the output node, and an output terminal coupled to the low voltage terminal;
a fourth switch having a control terminal coupled to the second node, an input terminal coupled to the first node, and an output terminal coupled to the low voltage terminal;
a fifth switch having a control terminal, an input terminal coupled to the first node, and an output terminal coupled to the low voltage terminal;
a sixth switch having a control terminal is coupled to the first node, an input terminal coupled to the second node, and an output terminal coupled to the low voltage terminal; and
a seventh switch having a control terminal coupled to a high voltage terminal, an input terminal coupled to the control terminal of the seventh switch, and an output terminal coupled to the second node,
wherein for the N-th shift register unit, the control terminal of the fifth switch receives the output signal generated by the following shift register unit to the N-th shift register unit.

7. The shift register as claimed in claim 6, wherein for the N-th shift register units, the carry signal received by the control terminal of the second switch is generated at the first node of a (N−2)-th shift register unit, and the output signal received by the control terminal of the fifth switch is generated by a (N+2)-th shift register unit.

8. The shift register as claimed in claim 3, wherein the discharging circuit of each of the shift register units comprises:
a third switch having a control terminal coupled to a second node, an input terminal coupled to the output node, and an output terminal coupled to the low voltage terminal;

a fourth switch having a control terminal coupled to the second node, an input terminal coupled to the first node, and an output terminal coupled to the low voltage terminal;

a fifth switch having a control terminal, an input terminal coupled to the first node, and an output terminal coupled to the low voltage terminal;

a sixth switch having a control terminal is coupled to the first node, an input terminal coupled to the second node, and an output terminal coupled to the low voltage terminal;

a seventh switch having a control terminal coupled to a third clock signal, an input terminal coupled to the control terminal of the seventh switch, and an output terminal coupled to the second node; and an eighth switch having a control terminal coupled to the second node, an input terminal coupled to the third clock signal, and an output terminal coupled to the control terminal of the eighth switch, wherein for the N-th shift register unit, the control terminal of the fifth switch receives the output signal generated by the following shift register unit to the N-th shift register unit.

9. The shift register as claimed in claim 8, wherein for the N-th shift register units, the carry signal received by the control terminal of the second switch is generated at the first node of a (N−2)-th shift register unit, and the output signal received by the control terminal of the fifth switch is generated by a (N+2)-th shift register unit.

10. The shift register as claimed in claim 9, wherein timing of the third clock signal is delayed from timing of the first clock signal, and timing of the second clock signal is delayed from the timing of the third clock signal.

11. The shift register as claimed in claim 8, wherein the discharging circuit of each of the shift register units comprises:

a ninth switch having a control terminal coupled to the control terminal of the second switch, an input terminal coupled to the second node, and an output terminal coupled to the low voltage terminal; and a tenth switch having a control terminal coupled to the control terminal of the fifth switch, an input terminal receiving the third clock signal, and an output terminal coupled to the second node.

12. The shift register as claimed in claim 11, wherein for the N-th shift register units, the carry signal received by the control terminal of the second switch is generated at the first node of a (N−2)-th shift register unit, and the output signal received by the control terminal of the fifth switch is generated by a (N+2)-th shift register unit.

13. The shift register as claimed in claim 12, wherein timing of the third clock signal is delayed from timing of the first clock signal, and timing of the second clock signal is delayed from the timing of the third clock signal.

14. The shift register as claimed in claim 1, wherein the shift register is processed with amorphous silicon technology, low temperature poly-silicon technology, or oxide thin film transistor technology.

15. A shift register comprising:

a plurality of successively cascaded shift register units, each controlled by a first clock signal and a second clock signal to generate an output signal at an output node, wherein each of the shift register units comprises:

a first switch having a control terminal coupled to a first node, an input terminal receiving the first clock signal, and an output terminal coupled to the output node;

a first capacitor coupled between the first node and the output node;

a second capacitor coupled between the output node and a ground terminal; and a second switch having a control terminal, an input terminal receiving the second clock signal, and an output terminal coupled to the first node, wherein a carry signal is generated at the first node, and wherein in a time period, a voltage level of the carry signal is higher than a high voltage level of the first clock signal.

16. The shift register as claimed in claim 15, wherein before or after the time period, the voltage level of the carry signal is at the high voltage level of the first clock signal.

* * * * *